United States Patent
Brewer et al.

(10) Patent No.: US 6,864,674 B2
(45) Date of Patent: Mar. 8, 2005

(54) LOSS MEASUREMENT SYSTEM

(75) Inventors: Lewis Brewer, Cardinal (CA); Maurice Secours, North Augusta (CA); Duane Brown, Cardinal (CA)

(73) Assignee: Measurements International Limited, Prescott (CA)

( * ) Notice: Subject to any disclaimer, the term of this patent is extended or adjusted under 35 U.S.C. 154(b) by 0 days.

(21) Appl. No.: 10/457,397

(22) Filed: Jun. 10, 2003

(65) Prior Publication Data

US 2004/0036464 A1 Feb. 26, 2004

Related U.S. Application Data

(60) Provisional application No. 60/388,753, filed on Jun. 17, 2002.

(51) Int. Cl.[7] .................................................. G01R 7/00
(52) U.S. Cl. .......................................... 324/142; 324/74
(58) Field of Search ........................ 324/74, 96, 130 R, 324/107, 113–115, 117 R, 141–142

(56) References Cited

U.S. PATENT DOCUMENTS

| | | | | |
|---|---|---|---|---|
| 4,012,617 A | * | 3/1977 | Burke et al. ................. | 219/716 |
| 4,896,106 A | * | 1/1990 | Voisine et al. ............... | 324/142 |
| 5,537,029 A | * | 7/1996 | Hemminger et al. ........ | 324/142 |
| 6,459,252 B1 | * | 10/2002 | Bierer ....................... | 324/72.5 |

* cited by examiner

*Primary Examiner*—Minh N. Tang

(57) ABSTRACT

A loss measurement system for measuring power, voltage and current losses in distribution transformers, medium power motors and turbines. The system has a sampling wattmeter that digitizes the voltage and current and performs appropriate calculations to determine power; and computer/controller and associated software/firmware and ancillary equipment that provide control, monitor, display and related functions.

6 Claims, 5 Drawing Sheets

LOSS MEASUREMENT SYSTEM

PRIOR APPLICATION

This application claims the benefit of U.S. Provisional Application Ser. No. 60/388,753, filed Jun. 17, 2002 entitled "LOSS MEASUREMENT SYSTEM".

FIELD OF THE INVENTION

The present invention relates to the cost-effective measurement of power losses in equipment such as transformers, motors and turbines, and in particular as applied to low to medium power distribution transformers, motors and turbines.

BACKGROUND OF THE INVENTION

The accurate measurement of electric power and energy is increasingly important as a way to manage costs in an ever-growing industrial economy. The trend towards deregulating the electricity utilities has reinforced the importance of accurately determining losses in the electric power grids. High voltage transformers, medium voltage and low voltage distribution transformers are critical components of the power grids.

Currently very high accuracy systems, such as Measurement International (MI) Model LMS 2000/100 are available, which are designed for measuring losses in high voltage, large power transformers, large motors and turbines. The Model LMS 2000/100 is representative of a family of Models designed, built and sold by MI worldwide.

A high voltage loss measurement system like MI Model LMS 2000/100 has:

(i) Measurement Capability: 2000A at 100 KV, 50/60 Hz. Full scale accuracy maintained over the full range of both voltage (100 KV to 1 KV) and current (2000A to 2A). Single and 3-phase measurements can be performed;

(ii) System Accuracy: Power measurements <100 PPM (parts per million) voltage and current measurements <100 PPM, accurate to 2 sigma. Currently MI Model LMS 2000/100 has the best system accuracy available in the marketplace.

To achieve the high accuracy levels, expensive components, such as high voltage capacitors, time division multiplying (TDM) wattmeters, and capacitive voltage dividers are used.

The cost of high voltage loss measurement system precludes their practical application for measuring losses in distribution transformers, medium power motors and turbines.

Less expensive systems are available which utilize potential transformers or current transformers, e.g. Phenix Series TTS. However, the accuracies of such systems can be maintained only when full power is applied to the equipment under test. This is a serious practical limitation since transformers are expected to operate in their full range. Typical accuracy is 1,000 PPM, deteriorating to 2,000 PPM at half power, and worsening even further when power applied to the equipment under test is further reduced.

Interest in using the electrical power grid for Internet-related communications applications is growing. One undesirable side effect of this application is the presence of higher frequency waveforms, which can distort the accurate measurement of power. The systems presently available are sensitive to frequency. A loss measurement system that is insensitive to frequency characteristics up to the 6th harmonics is needed.

Accordingly, there is a need in the marketplace for a loss measurement system, insensitive to frequency characteristics, that can accurately and cost effectively measure losses in distribution transformers, medium power motors and turbines.

SUMMARY OF THE INVENTION

It is an object of the present invention to provide a loss measurement system for measuring losses in and calibrating distribution transformers, medium power motors and turbines for the full range of power applied to the equipment under test without deterioration in accuracy.

In accordance with the invention, medium voltage resistive divider components are used in lieu of high voltage capacitive divider components. The novel resistive voltage divider technique has virtually no frequency dependence characteristics.

As well, low voltage bushings and sampling wattmeter are used to achieve the accuracy and cost objectives of the invention.

Additional objects, features and aspects of the invention will become more apparent from the following description of preferred embodiments of the invention.

BRIEF DESCRIPTION OF THE DRAWINGS

The present invention will be more fully understood from reference to the attached drawings, which are given by way of illustration only of preferred embodiments of the invention. The embodiments illustrated are an arrangement for testing a 3-phase distribution transformer. A similar arrangement may be applied to test medium power motors and turbines.

In the drawings.

DETAILED DESCRIPTION OF PREFERRED EMBODIMENTS

Figure 1:
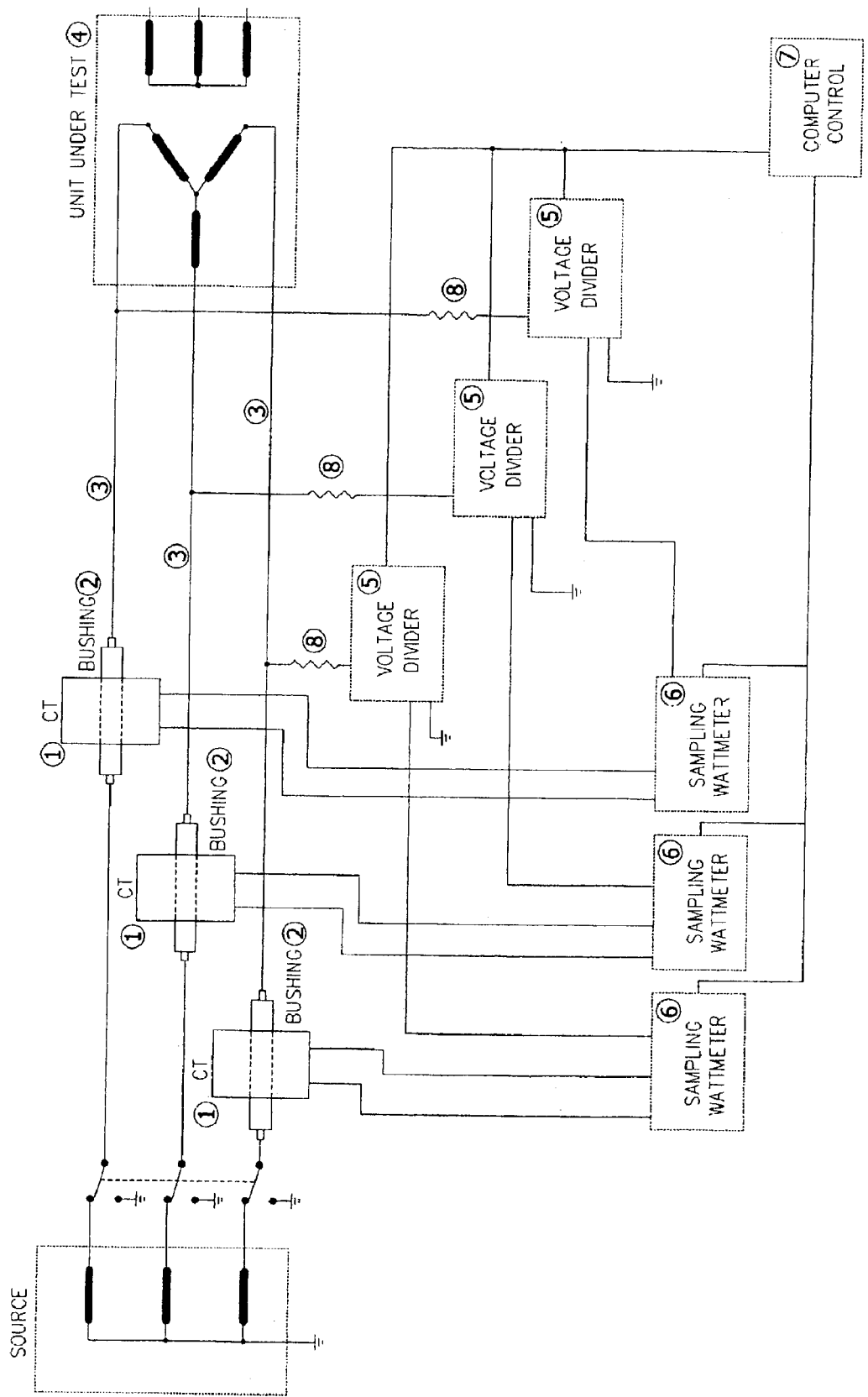
FIG. 1 is a block diagram of a preferred embodiment of the loss measurement system of the invention, illustrating the major subsystems.

With reference to FIG. 1, three medium voltage bushings (2) are connected to unshielded cables (3) which in turn are connected to the inputs of the transformer under test (4). Typically medium voltage (up to 38.5 KV) is applied to the transformer under test (4) via the unshielded cables (3) which are concentric with the active current transformer (1) and with the solid dielectric bushings (2) instead of the more expensive gas filled bushings as used in high voltage measurements (higher than 38.5 KV and typically 100 KV).

Inputs to the transformer under test (4) are connected to the high voltage resistors $R_H$ (8) in series with inputs to the active voltage dividers (5) using the unshielded cables (3). Outputs from the active voltage dividers (5) are connected to the voltage inputs of the sampling wattmeters (6) and to the computer/controller (7).

The current outputs from the active current transformer (1) are connected to the inputs of the sampling wattmeters (6). Outputs from the sampling wattmeters (6) are connected to the computer/controller (7).

External power to the transformer under test (4) is manually turned on and gradually ramped up to the desired test level. Once the power level has stabilized, the rest of the test sequence is done automatically under software control. The software samples two A/D cards at the same time, multiplies the readings, and calculates the power (in watts).

The software is also used to control the instruments via an IEEE488 interface bus. The software is used to control the ranging of the current transformer and the high voltage divider. This information is used to scale the watts reading.

The software is also used to add the calibration factors of the components (CT, HVD) to scale the watts reading. The software typically updates the display every one second.

Preferably the software displays the results as follows: RMS volts, average volts, RMS current, average current, power and losses (in watts).

Typically the software calculates 3-phase power for both delta and wye measurements.

The worst case accuracy for the present invention is 100 PPM maintained over the full range of readings.

By way of comparison, loss measurement systems, which employ potential transformer or current transformer techniques, have accuracy of 1,000 PPM only when full power is applied to the equipment under test. The accuracy deteriorates when less power is applied, typically about 2,000 PPM at half power and worse with lower power.

A factor of more than 10 improvement in accuracy is very significant in determining the losses in transformers and similar equipment.

Figure 2:
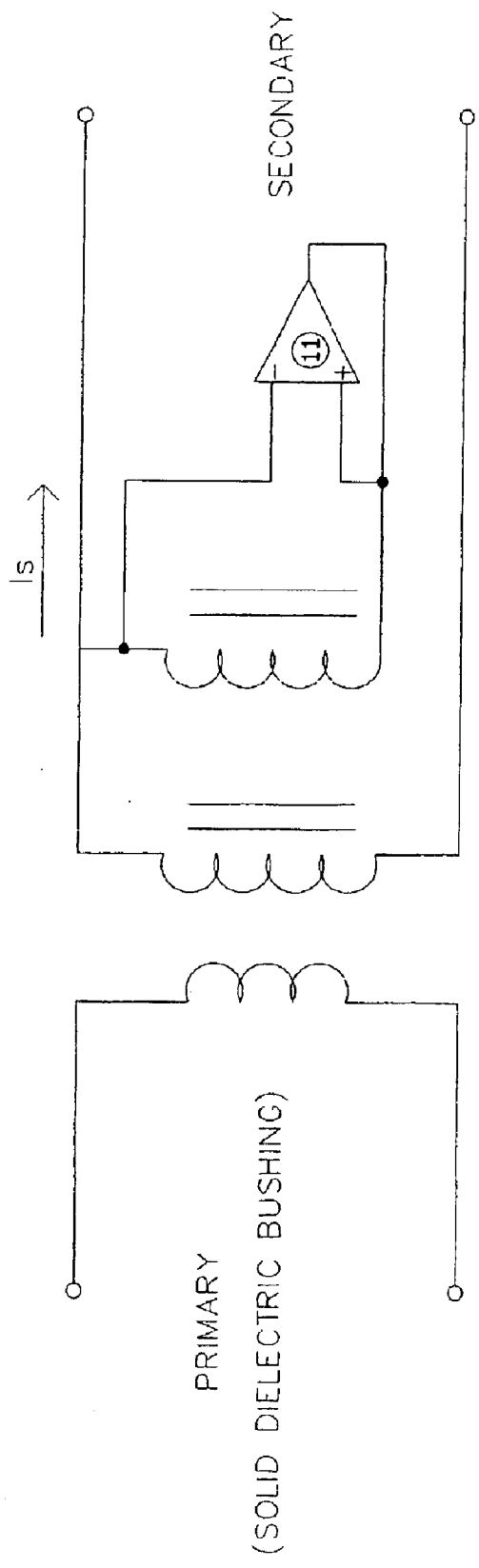
FIG. 2 is a diagram illustrating an active current transformer of the FIG. 1 system.

Referring to FIG. 2, the active current transformer (1) employs a standard technique of using an electronic amplifier (11) to ideally eliminate any errors caused by the sampling wattmeter (6) loading the secondary winding of the current transformer. The circuitry deployed in the invention is such that the accuracy of the secondary current $I_S$ is within a few PPM.

Figure 3:
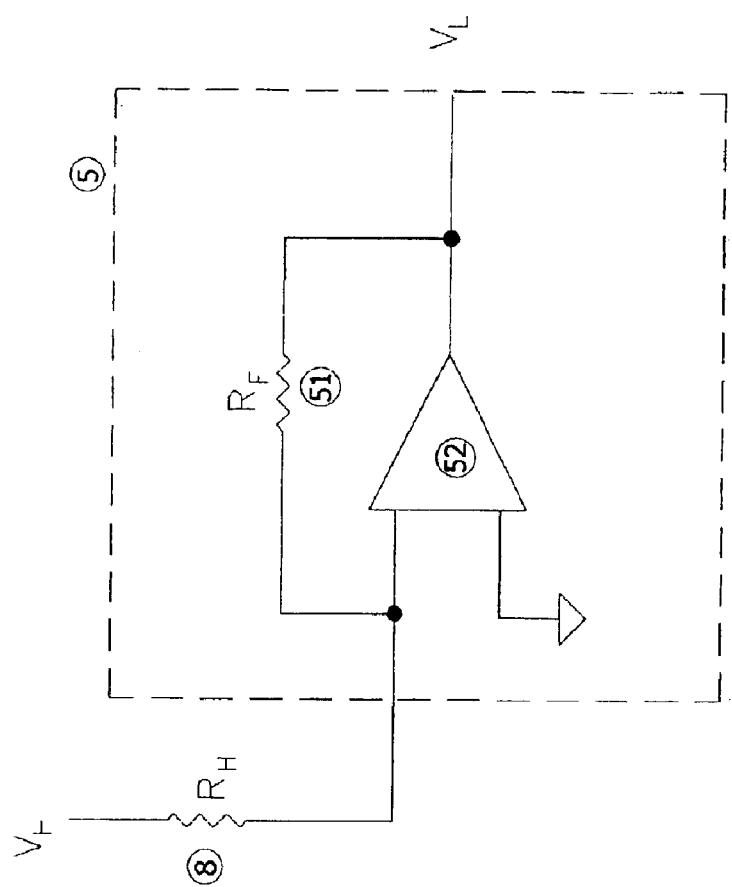
FIG. 3 illustrates a high voltage resistor and active voltage divider from the FIG. 1 block diagram.

Referring to FIG. 3, the resistive voltage divider consists of two main elements. One, the high voltage resistor $R_H$ (8) is of a special design to minimize the effects of power dissipation due to stray capacitance and two, the active voltage divider (5).

Due to limitations in the gain bandwidth of the amplifier (52) and the feedback component $R_F$ (51) for a multirange device, it is necessary to incorporate a feedback circuit.

Figure 4:
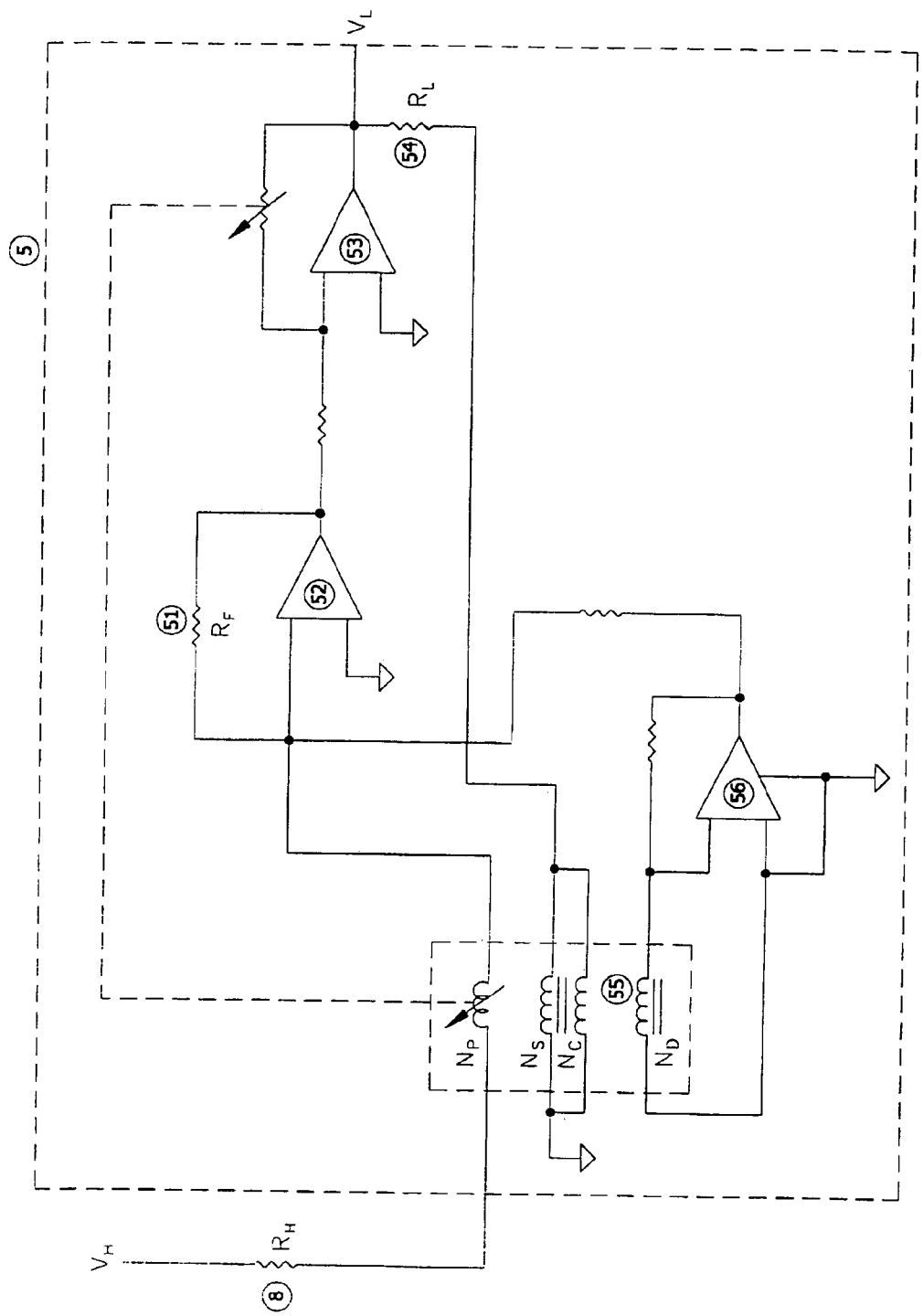
FIG. 4 is a schematic illustrating additional details of the high voltage resistor and active voltage divider of the FIG. 1 system.

Referring to FIG. 4, a precision current transformer (55), a stable loading resistor $R_L$ (54) and a feedback circuit (56) are introduced. The accuracy and stability of the circuit are increased, allowing for the addition of the variable gain circuit (53).

The transfer function of the resistive voltage divider is:

$$V_L = \frac{R_L}{R_H \times (Ns/Np)} \times V_H$$

The resistive voltage divider is a precision divider which depends only on three critical components: high voltage resistor $R_H$ (8), low voltage resistor $R_L$ (54) and the precision current transformer (55).

This invention has greatly reduced cost compared to the capacitive voltage divider used in systems such as the MI Model LMS 2000/100, and comparable cost compared to systems which use potential transformers or current transformers such as Phenix Series TTS.

The performance of the invention is at least a factor of 10 better than that of commercially available methods used in loss measurement systems for distribution transformers.

Several gain stages are provided to ensure that the output voltage is always operated at near or full scale. To change gain on the resistive voltage divider, a decrease in the current-comparator-winding ratio (Ns/Np) is required to maintain ampere-turn balance.

Relays, which are used to change the electronic gain and winding ratio, are driven simultaneously to keep the winding ratio times the gain constant. The gain of the divider is set, at 1, 2, 5, 10, 20, 50, 100 where 1 corresponds to $V_H$ at 38.5 KV and a gain of 100 would represent $V_H$ at 385 V.

The uncertainty of the resistive voltage divider is equal to the uncertainty associated with the precision current transformer (55) and the uncertainty of $R_H$ (8) and $R_L$ (54).

Thus as illustrative of the resistive voltage divider invention, the preferred embodiment has an expected accuracy of 100 PPM.

By way of comparison, the expected accuracy of a capacitive voltage divider is about 10 PPM. The lower accuracy of the resistive voltage divider is traded off against the higher accuracy of the capacitive voltage divider in favor of lower cost and superior frequency characteristics.

Additionally, the resistive voltage divider is operated at low voltage, typically 15 VDC rail, which dispenses the use of high voltage power supply, eliminating turn-on time delay due to high voltage power supply ramp up.

Also, line-to-line buffers typically used in high voltage application are eliminated since the output voltage of the resistive voltage divider is typically about 2V, and can be directly connected to the input of the sampling wattmeter (6).

The novel features of the resistive voltage divider all contribute to the fulfilment of the object of the invention.

Figure 5:
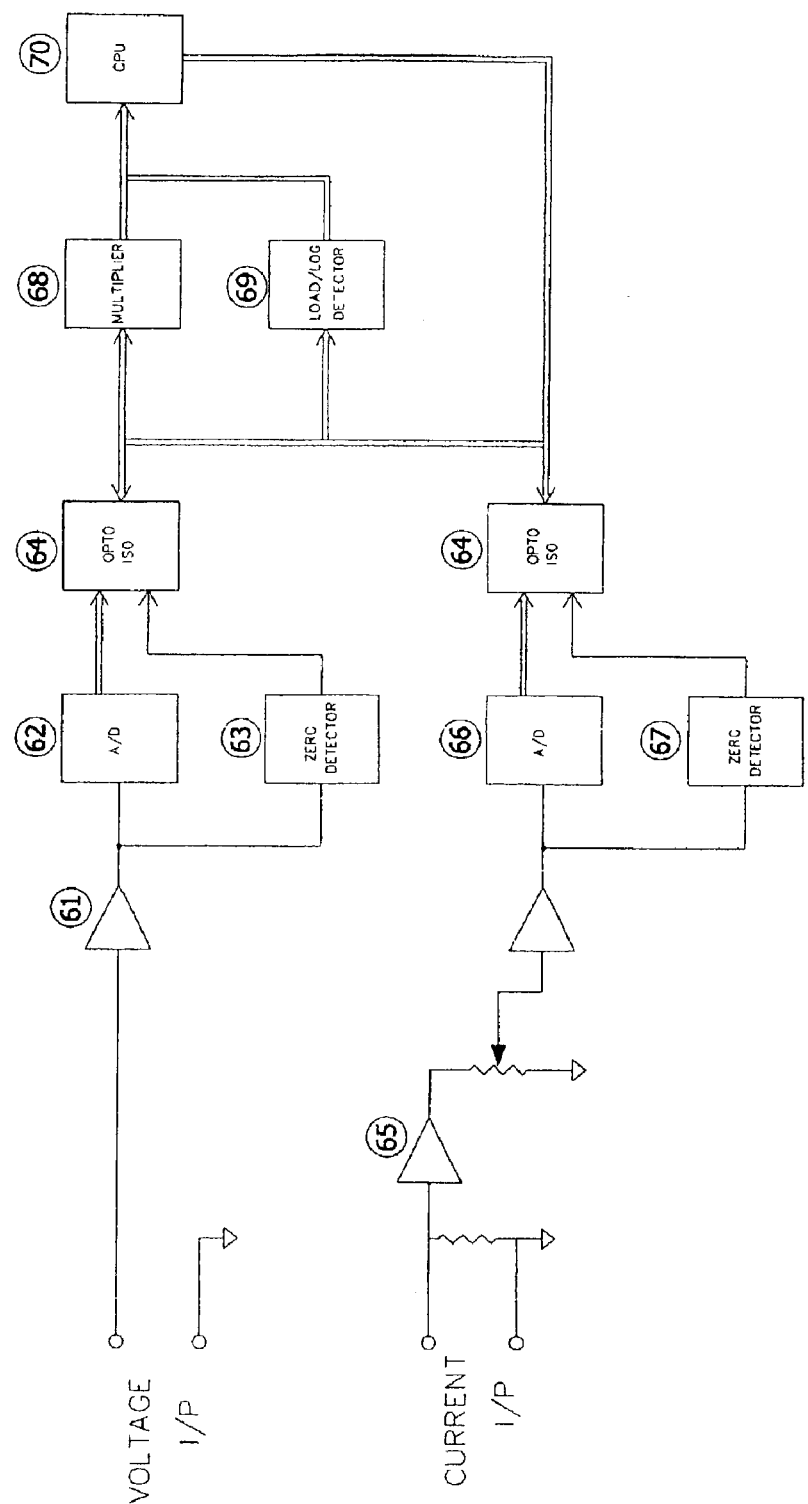
FIG. 5 is a diagram illustrating in more detail a sampling wattmeter of the FIG. 1 system.

Referring to FIG. 5, operation of the sampling wattmeter is described as follows.

The input voltage is fed into a buffer (61) to unload it from the effect of the input leads. This buffer feeds a zero crossing circuit (63) and an A/D converter circuit (62).

The input current is fed through a resistive shunt and a variable gain circuit (65). This input conditioning circuit then feeds into a zero crossing circuit (67) and an A/D converter circuit (66) that is identical to that on the voltage side. The A/D are synchronized to sample in the same time period. The A/D outputs are fed through opto-couplers (64) to a real time multiplier (68). The zero crossing circuits outputs are fed through opto-couplers (64) to the lead/lag detector circuit (69) which calculates the time difference between the current and voltage signals. The outputs from these circuits are sent to the CPU (70) that calculates watts, power factor etc. and transmits this information to the system controller.

It will be appreciated that the system described divides down the voltage applied to the equipment under test to manageable or safe values for the purpose of measuring losses. Typically, the voltage may be divided down from between 100 and 200 KV to about 120 V (or 240 V). Similarly, the system may divide the current applied to the equipment under test from between 2,000 and 4,000 amperes to 1 ampere, again a safe value.

We claim:

1. A loss measurement system for measuring power, voltage and current losses in distribution transformers, medium power motors, turbines and similar equipment, under test, wherein said system comprises:

(i) active current transformer that transforms a current applied to the equipment under test to manageable values for the purpose of measuring losses in the equipment under test;

(ii) resistive voltage divider that divides down a voltage applied to the equipment under test to manageable values for the purpose of measuring losses in the equipment under test;

(iii) sampling wattmeter that digitizes said voltage and said current and performs appropriate calculations to give power;

(iv) computer/controller and associated software/firmware and ancillary equipment that provide control, monitor, display and related functions.

2. A system as in claim 1 wherein an accuracy of measurement is 100 PPM full range or better with insignificant frequency characteristics.

3. A system as in claim 1 wherein said system utilizes one (1) active current transformer, one (1) resistive voltage divider and one (1) sampling wattmeter for measuring losses in distribution transformers in single phase power system applications.

4. A system as in claim 1 wherein said system utilizes three (3) active current transformers, three (3) resistive voltage dividers and three (3) sampling wattmeters for measuring of losses in distribution transformers in 3-phase power system applications.

5. A system as in claim 1 wherein the losses of medium power motors and turbines are measured.

6. A system as in claim 1 wherein a solid dielectric bushing is used to physically, and electrically isolate the active current transformer from unshielded cables that connect a source of input power to the equipment under test.

* * * * *